United States Patent
Nelson et al.

(10) Patent No.: US 8,883,014 B2
(45) Date of Patent: Nov. 11, 2014

(54) MONOLITHICALLY FORMED EWOD DEVICE AND METHOD OF MAKING THE SAME

(75) Inventors: Wyatt C. Nelson, Seattle, WA (US); Chang-Jin Kim, Beverly Hills, CA (US)

(73) Assignee: The Regents of the University of California, Oakland, CA (US)

(*) Notice: Subject to any disclaimer, the term of this patent is extended or adjusted under 35 U.S.C. 154(b) by 312 days.

(21) Appl. No.: 13/486,777

(22) Filed: Jun. 1, 2012

(65) Prior Publication Data
US 2012/0305400 A1 Dec. 6, 2012

Related U.S. Application Data

(60) Provisional application No. 61/493,312, filed on Jun. 3, 2011.

(51) Int. Cl.
*C23F 1/00* (2006.01)
*B81C 1/00* (2006.01)
*B01L 3/00* (2006.01)

(52) U.S. Cl.
CPC ..... *B81C 1/00119* (2013.01); *B01L 2400/0427* (2013.01); *B81B 2201/058* (2013.01); *B01L 3/502707* (2013.01); *B01L 3/502792* (2013.01)
USPC .................. 216/2; 216/13; 438/689; 422/504

(58) Field of Classification Search
CPC .................. B01L 2300/0816; B01L 3/502707
USPC ............... 216/2, 13; 438/689; 422/504
See application file for complete search history.

(56) References Cited

U.S. PATENT DOCUMENTS

2007/0023292 A1* 2/2007 Kim et al. .............. 204/643

OTHER PUBLICATIONS

Nelson, W.C. et al., Monolithic Fabrication of EWOD Chips for Picoliter Droplets, Journal of Microelectromechanical Systems, vol. 20, No. 6, Dec. 2011.
Cho, S.K. et al., Creating, Transporting, Cutting, and Merging Liquid Droplets by Electrowetting-Based Actuation for Digital Microfluidic Circuits, J. Microelectromechanical Systems, vol. 12, No. 1, pp. 70-80, Feb. 2003.
Pollack, M.G. et al., Electrowetting-based actuation of liquid droplets for microfluidic applications, Appl. Phys. Lett., vol. 77,No. 11, pp. 1725-1726, Sep. 2000.

* cited by examiner

*Primary Examiner* — Roberts Culbert
(74) *Attorney, Agent, or Firm* — Vista IP Law Group LLP

(57) ABSTRACT

A monolithic fabrication method of parallel-plate electrowetting-on-dielectric (EWOD) chips for digital microfluidics of picoliter droplets is disclosed. Instead of assembling a second substrate to form a top plate, the top plate is generated in situ as a thin-film membrane that forms a monolithic cavity having a gap height on the order of micrometers with excellent accuracy and uniformity. The membrane is embedded with EWOD driving electrodes and confines droplets against the device substrate to perform digital microfluidic operations. Two main attributes of the monolithic architecture that distinguish it from tradition methods are: (i) it enables excellent control of droplet dimensions down to the micrometer scale, and (ii) it does not require the typical alignment and assembly steps of the two plates.

14 Claims, 10 Drawing Sheets

MONOLITHICALLY FORMED EWOD DEVICE AND METHOD OF MAKING THE SAME

RELATED APPLICATION

This Application claims priority to U.S. Provisional Patent Application No. 61/493,312 filed on Jun. 3, 2011. Priority is claimed pursuant to 35 U.S.C. §119. The above-noted Patent Application is incorporated by reference as if set forth fully herein.

TECHNICAL FIELD

The field of the invention generally relates to electrowetting or electrowetting-on-dielectric (EWOD) devices for droplet or digital microfluidics and methods of making the same.

BACKGROUND

Digital microfluidic systems based on electrowetting are attractive because they enable fluid actuation by electrical signals alone, thereby reducing the complexity of the chip as well as the overall system. Such electrically driven microfluidic devices, particularly using the EWOD chip configurations, have shown promise as generic platforms because they can be reprogrammed on-the-fly using software to accommodate various biochemical protocols. Further, because EWOD chips have low power requirements, it is conceivable to build a handheld (e.g., cellphone-like) system that runs on batteries.

Most EWOD-based digital microfluidic devices have one of the following generic architectures: parallel-plate or open-planar. Of these, the former is often preferred, despite the additional steps in fabrication, for its utility and reliability in applications. For example, it is far easier to generate droplets and split them apart when a liquid is squeezed between two parallel plates. Also, controlling the device gap (between the plates) is a reliable way to scale the working fluid. In comparison, on an open-planar device, droplet dimensions are determined by the contact angle, which is nearly impossible to control or predict with accuracy. Third, if the gap is much smaller than the capillary length (e.g., 2-3 mm for water), large droplets are insensitive to inertial forces. The same cannot be said for open-planar devices unless the droplet volume is small, i.e., the diameter is much smaller than the capillary length.

Traditional parallel-plate EWOD device manufacturing begins with thin film deposition and patterning of the two plates, typically a bottom substrate patterned with EWOD electrodes and a top plate with a blank conductive layer, and ends with assembly. FIG. 1 illustrates an EWOD device 2 according to the prior art. The EWOD device 2 includes a transparent top plate 4 and a bottom EWOD substrate 6 (e.g., plate) that includes surface electrodes 8. A spacer 10 is used to separate the top plate 4 from the lower plate 6. Overall, the plates 4, 6 are fabricated in the clean room, for example, using one step each of metallization, photolithography, and dielectric deposition. The assembly process, which can be performed using a variety of methods, involves alignment of the two plates 4, 6 (which is not critical for most applications because the ground plate is unpatterned), fabricating and positioning spacers 10, and bonding of the plates 4, 6. The last two steps determine the gap between the plates 4, 6 and therefore the thickness of the droplets 12. It is common to align and affix cutouts of an adhesive spacer, e.g., double-sided tape, to the plates for spacing and bonding. While this practice is acceptable for fabricating parallel-plate EWOD devices with relatively large gaps (i.e., >50 μm), when smaller gaps are desired, a thick photoresist (e.g., SU-8) can be coated and lithographically defined as a spacer, and additional provisions, e.g., external alignment and clamping mechanisms, are employed to hold the plates together.

While EWOD devices can be formed using the two plate construction described above, there is a need for EWOD devices that use smaller and smaller droplets down to the micrometer scale (e.g., sub-nanoliter volumes). Moreover, the alignment and assembly steps required to form the two plate construction adds cost and complexity. There is a need for an improved EWOD device and method of making the same that is able to provide form small and uniform gaps that enable picoliter-sized droplets to be manipulated in the EWOD device.

SUMMARY

In one embodiment, a method of fabricating an EWOD device includes providing a substrate having at least a sacrificial layer disposed thereon; selectively etching portions of the sacrificial layer to form anchor points; depositing a structural layer atop the sacrificial layer; patterning a plurality of EWOD electrodes before, after, or during the structural layer deposition; forming a plurality of release openings in the structural layer; releasing the structural layer containing the plurality of EWOD electrodes from the substrate by sacrificial etching; and coating the surfaces of the structural layer and substrate with a hydrophobic material.

In another embodiment, an EWOD device includes a substrate; a structural layer separated at least partially from the substrate and defining a gap; a plurality of EWOD electrodes embedded within the structural layer; and a hydrophobic material coating the opposing surfaces of the substrate and the structural layer.

BRIEF DESCRIPTION OF THE DRAWINGS

FIG. 7A shows the dry condition. FIG. 7B illustrates the partially filled condition. FIG. 7C illustrates the fully filled condition. FIG. 7D illustrates loading the cavity by EWOD actuation (voltage being applied to electrode).

DETAILED DESCRIPTION OF THE ILLUSTRATED EMBODIMENTS

Figure 1:
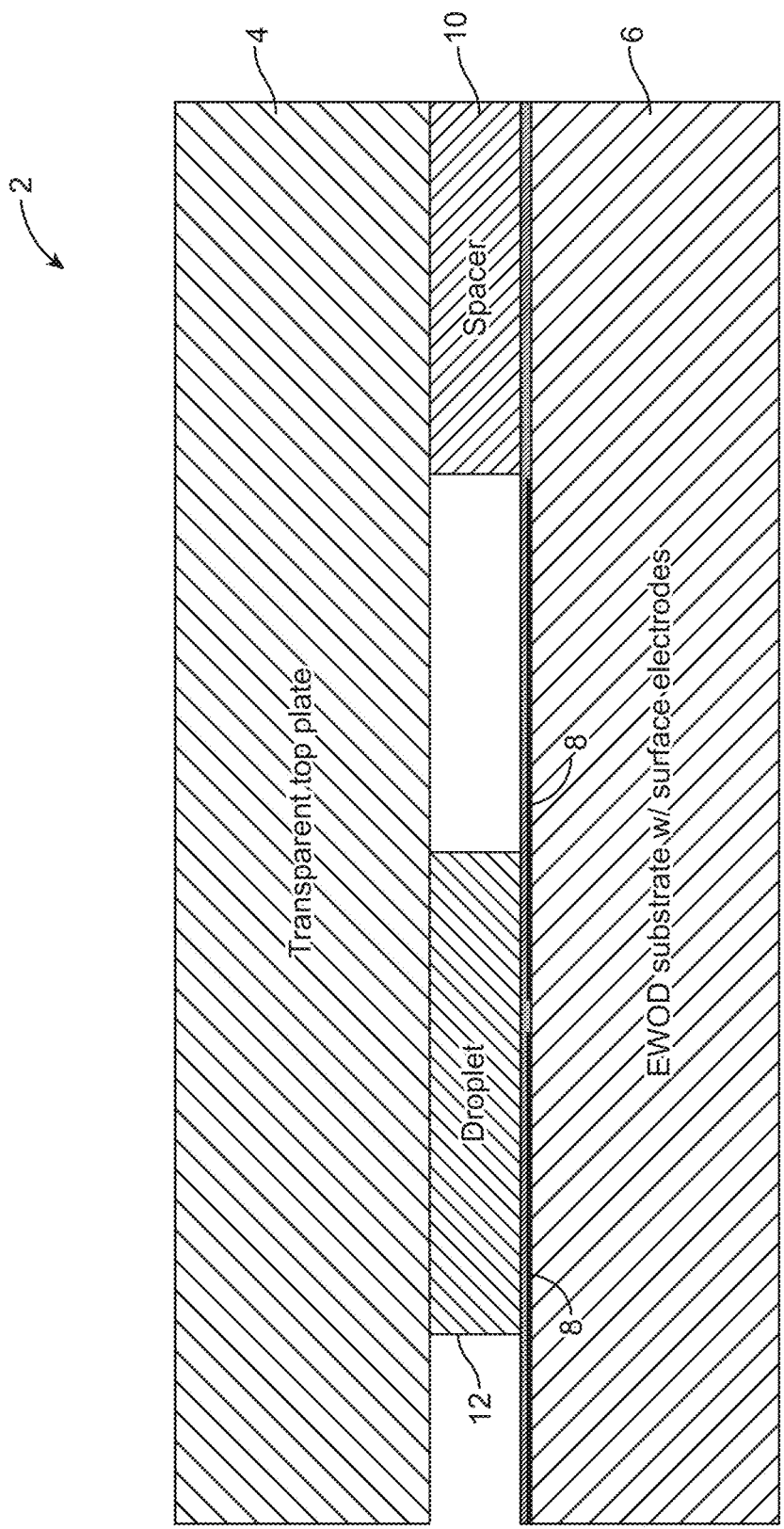
FIG. 1 illustrates an EWOD device according to the prior art.
Figure 2:
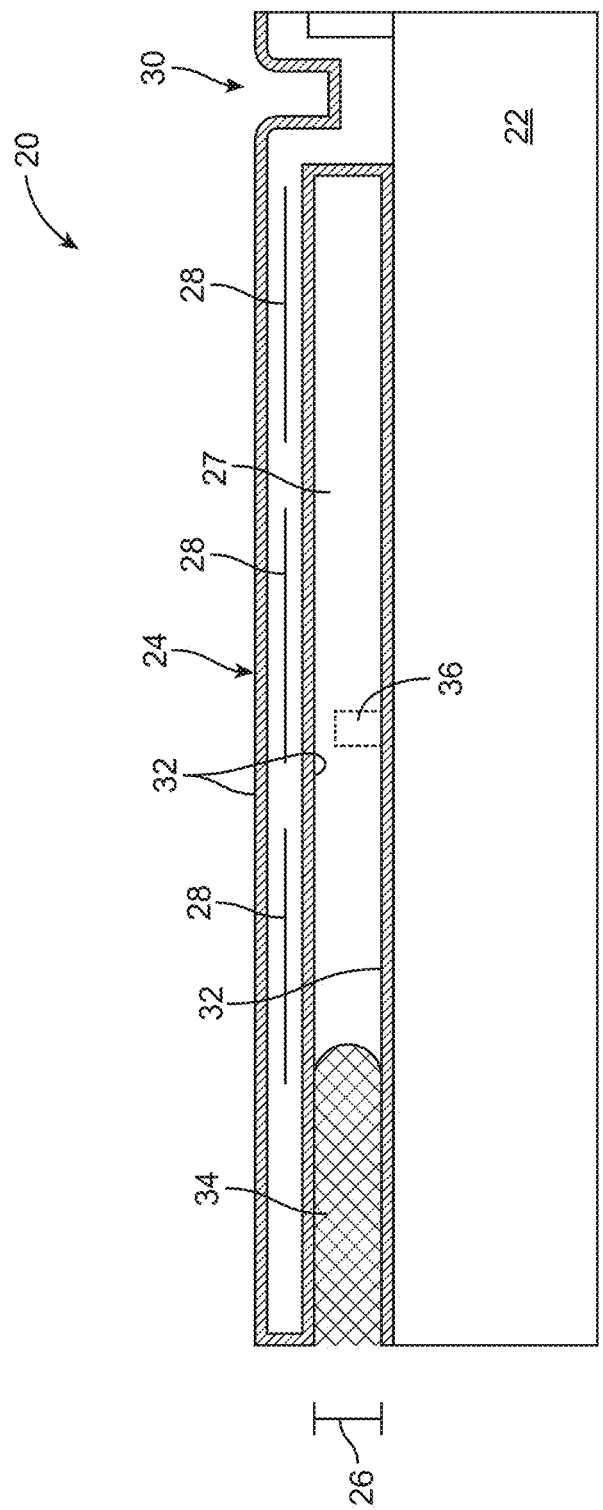
FIG. 2 illustrates a side schematic representation of a monolithic EWOD device according to one embodiment.

FIG. 2 illustrates a side schematic representation of a monolithic EWOD device 20 according to one embodiment. The monolithic EWOD device 20 does not use a separate top plate that is aligned with a bottom substrate as illustrated in FIG. 1. Rather, the EWOD device 20 includes a first layer 22 (e.g., bottom layer in FIG. 2). Being a substrate, the first layer 22 may be made of silicon, glass, quartz, plastic, etc. For another example, the silicon based substrate that forms the first layer 22 may be the handle layer of a silicon-on-insulator (SOI) wafer. A second layer 24 is separated from this first layer 22 by a gap 26. The second layer 24 is a structural layer that is formed (e.g., micromachined) as a thin-film membrane that forms a monolithic cavity 27 that has a gap 26 with a height that is on the order of one to tens of micrometers with excellent accuracy and uniformity. The second layer 24 is formed from a dielectric material such as silicon nitride ($Si_xN_y$). Individual EWOD electrodes 28 are embedded within the second layer 24 as seen in FIG. 2. The second layer 24 is secured to the first layer 22 at one or more locations at anchor points 30. The EWOD device 20 includes a hydrophobic layer 32 including in the cavity 27 (e.g., CYTOP or PTFE). A droplet 34 is illustrated within the cavity 27. The droplet 34 may include a fluid such as water, oil, or even a gas droplet. The droplet 34 may be surrounded by carrier fluid (not shown) in some embodiments. For example, the droplet 34 may be an aqueous droplet that is surrounded by an oil-based carrier medium. The droplet 34 may have sub-nanoliter volumes (e.g., picoliter-sized volumes).

Two main attributes of the EWOD device 20 of FIG. 2 that make it different than the device of FIG. 1 are: (1) the device can be constructed with excellent control of the dimensions of the droplet 34—down to the micrometer scale, and (2) the EWOD device 20 does not require the typical alignment and assembly steps. In this embodiment, the second layer 24 is micromachined, in situ, on the first layer 22.

The EWOD device 20 may be designed to have a specific height of the gap 26, which is defined by the sacrificial layer that is selectively removed by sacrificial etching. For example, in some embodiments, the gap has a height of less than or equal to 50 μm. In still other embodiment, it may be smaller, for instance, a height of less than or equal to 10 μm. The gap 26 may also be substantially uniform across the entire length of the cavity 27 (e.g., +/−0.5 μm across entire wafer). In one alternative embodiment, the cavity 27 may have one or more optional surface features 36. The surface features 36 may be posts, walls, or the like that are defined within the space of the gap 26. For example, the surface features 36 may be used to form a constriction pathway for fluid flow. The surface features 36 may be lithographically formed within the gap 26.

Figure 3A:
FIGS. 3A-3F illustrate a process of making the EWOD device of FIG. 2.
Figure 3B:
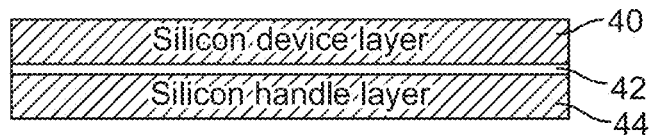
Figure 3C:
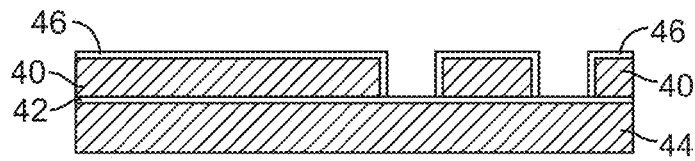

FIGS. 3A-3F illustrates a process of making a monolithic EWOD device 20 according to one embodiment. As seen in FIG. 3A, the starting material is a 4" SOI wafer with a 10 μm-thick device layer 40, 0.25 μm thick buried $SiO_2$ layer 42, and 525 μm-thick handle layer 44 (resistivity=0.01–0.02 Ω·cm). The device layer 40 may have different thicknesses. For example, the device layer 40 may have a thickness of less than or equal to 20 μm or even 5 μm. As seen in FIG. 3B, the process begins with photolithographic patterning and deep reactive-ion-etching of the silicon device layer 40. The recesses etched in this step define the anchors 30 of the eventual second layer 24 membrane. Wet thermal oxidation is used to grow an oxide layer 46 (e.g., 100 nm of $SiO_2$) on all exposed silicon. The oxide layer 46 is generally less than 1 μm in thickness. This oxide layer 46 is necessary to protect the second layer membrane 24 from the release etch, discussed below. As seen in FIG. 3C, a first silicon nitride ($Si_xN_y$) layer 48 is deposited on the oxide layer 46. The first silicon nitride layer 48 may include a 1 μm low-stress silicon nitride layer that is deposited by plasma-enhanced chemical vapor deposition (PEVCD). Still referring to FIG. 3C, metals 50 (e.g., 7/100 nm Ti/Au) are then deposited onto the substrate by electron-beam evaporation. The metals 50 are photolithographically patterned and wet etched (Au was etched by commercial gold etchant; Ti was etched by a commercial buffered oxide etchant containing HF) to form electrodes 28. Another photolithography and wet etch are used to selectively remove Au from electrodes 28 disposed on the second layer membrane 24, leaving behind the transparent Ti electrodes 28. The electrodes 28 do not need to be transparent.

It should be noted that, while not illustrated in FIGS. 3A-3F, Au remains on contact pads and lead wires on the chip. The 7 nm of Ti serves as an adhesion layer for the Au as well as a highly transparent and sufficiently conductive layer for EWOD actuation. It is therefore unnecessary to add another layer, e.g., ITO, to form transparent actuation pads.

Figure 3D:
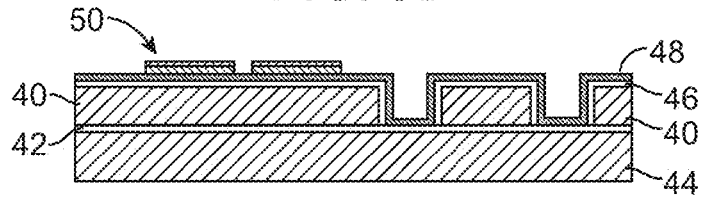
Figure 3E:
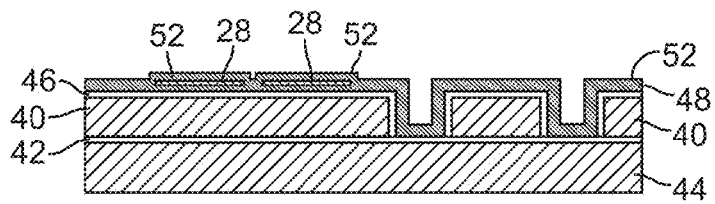
Figure 3F:
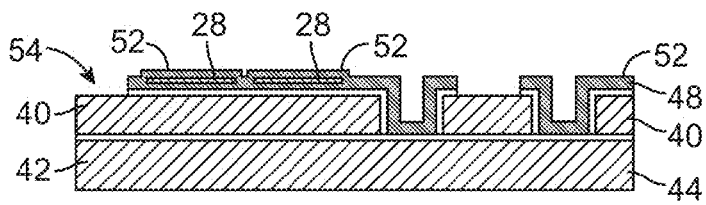

With reference now to FIG. 3D, a second silicon nitride layer 52 is deposited. The second silicon nitride layer 52 may include a low-stress $Si_xN_y$ layer (3 μm thick) that is deposited by PECVD. In a next step, which is not seen in FIGS. 3A-3F because it is outside of the view, the second silicon nitride layer 52 is subject to photolithographic patterning and $CF_4$ plasma etching to uncover electrical contact pads at the edge of each chip on the wafer. Now referring to FIG. 3E, release holes 54 are patterned and etched using $CF_4$ plasma. Now referring to FIG. 3F, the second membrane layer 24 is released from the underlying device layer 40 by $XeF_2$ vapor-phase etching, thereby forming the monolithic cavities 27. The device is then spin coated (e.g., 6000 rpm for 120 seconds) with a hydrophobic polymer solution (1 wt % CYTOP) and baked in an oven at 150° C. for 10 minutes to form a hydrophobic layer 56.

Figure 4A:
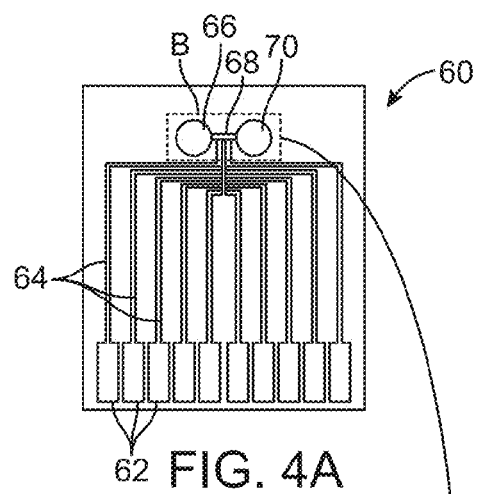
FIG. 4A illustrates an EWOD chip according to one embodiment.
Figure 4B:
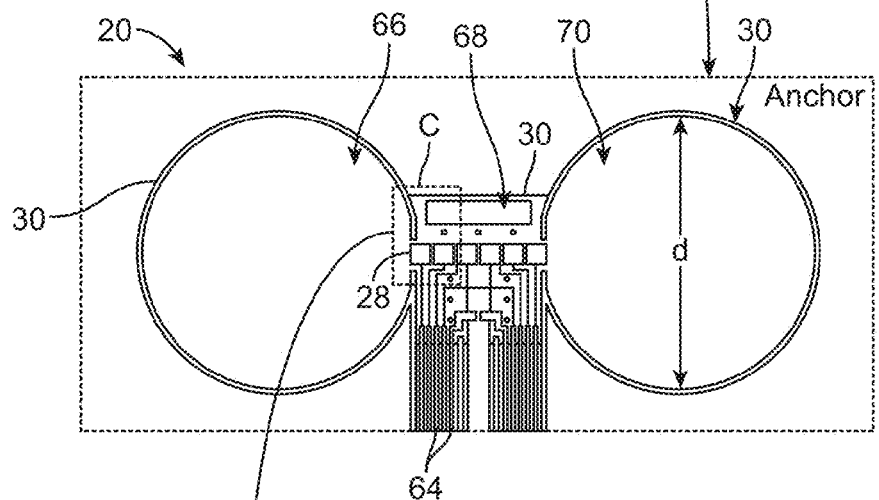
FIG. 4B illustrates detail B of FIG. 4A.
Figure 4C:
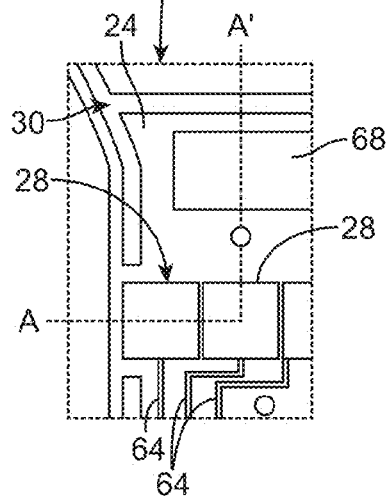
FIG. 4C illustrates detail C of FIG. 4B.

FIGS. 4A, 4B, and 4C illustrate the layout of the EWOD device 20 at three size scales. FIG. 4A illustrates an EWOD chip 60 with electrical contact pads 62 shown with respective leads or conductors 64 leading to the EWOD electrodes 28 (best seen in FIGS. 4B and 4C). FIG. 4B illustrates an enlarged view of detail B of FIG. 4A. Release openings 66, 68, 70 are illustrated. Release openings 66, 70 serve as respective liquid reservoirs. Liquid reservoirs 66, 70 may have a diameter d on the order of about 1 mm. Release opening 68 provides the $XeF_2$ etchant access to the silicon beneath the membrane layer 24. FIG. 4C is an enlarged view of detail C of FIG. 4B. FIG. 4C illustrates anchor 30 along with EWOD electrodes 28 being coupled to respective conductors 64. The cross section A-A' corresponds to the fabrication process of FIGS. 3A-3F.

As seen in FIGS. 4A-4C, there are three basic components: anchors 30, electrodes 28, and a membrane (second layer membrane 24). Anchors 30 are the structural linkages between the silicon substrate and the suspended membrane 24. Also, anchors 30 serve as etch stops (in the direction parallel to the silicon wafer surface) during the membrane 24 release etch and define the area of the cavities 27. Note that the EWOD electrodes 28 are embedded within the silicon nitride membrane, i.e., within the second layer 24. Typical assembled parallel-plate EWOD chips have the actuation electrodes on the bottom substrate. Whether the electrodes are in the "top" or "bottom" substrate is not an important distinction given that they are relative terms—the key distinction of the monolithic EWOD chip 60 from the prior art assembled chips like that of FIG. 1 is that the EWOD dielectric is deposited before the electrodes instead of after.

Release openings 66, 68, 70 in the silicon nitride membrane layer 24 allow access to the sacrificial layer etchant during the formation of the cavity 27 located beneath the silicon nitride membrane layer 24. Also, release openings 66, 68, 70, if placed near or on top of the EWOD electrodes 28, can serve as liquid source or waste reservoirs during device operation. For example, two large circular release openings 66, 70 (diameter=1 mm) were each filled with liquid (~1 µL each) device experiments described herein.

The monolithic architecture illustrated in FIG. 2 utilizes parallel-plate actuation because the handle wafer 44 is electrically grounded, and actuation force is delivered via electrodes 28 embedded in the membrane layer 24. As in most parallel-plate systems, the droplet 34 is not actually grounded, but the dielectric covering the grounding plate (the substrate as described herein) is very thin compared to that covering the actuation electrodes 28, so the latter represents the dominant capacitance in the circuit.

Figure 5A:
FIGS. 5A-5E illustrate a process of making the EWOD device according to another embodiment.
Figure 5B:
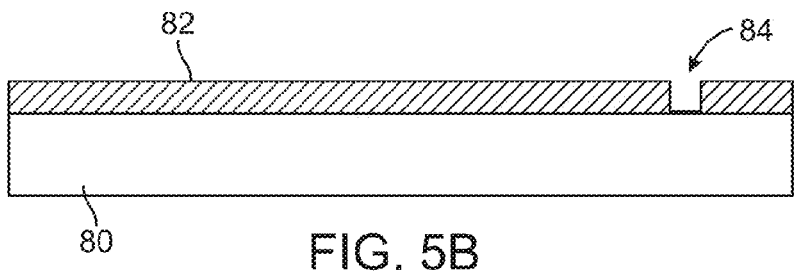
Figure 5C:
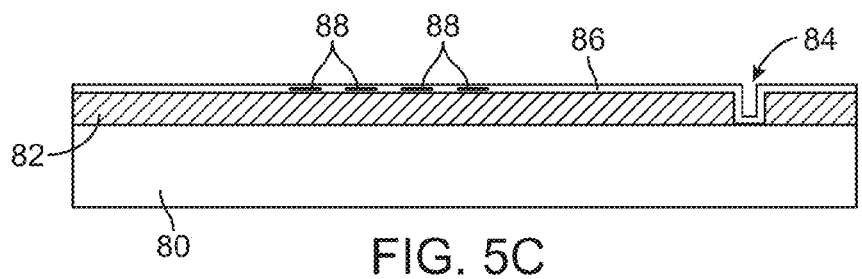
Figure 5D:
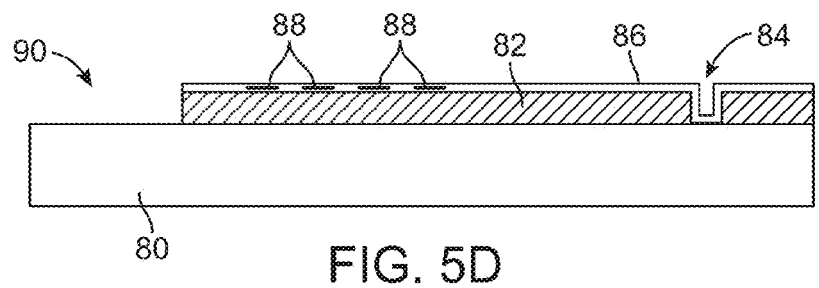
Figure 5E:
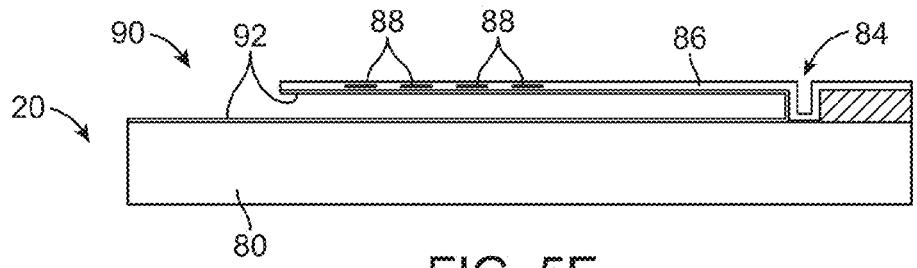

FIGS. 5A-5E illustrate another method of manufacturing an EWOD device 20. In this method, as seen in FIG. 5A, a substrate 80 is provided that includes at least a sacrificial layer 82 disposed atop the substrate 80. The substrate 80 may include any substrate typically used in integrated circuit fabrication techniques including, but not limited to, quartz, glass, alumina wafer, and silicon-based substrates. The sacrificial layer may have a thickness ranging between about 1 µm and 50 µm although other thicknesses outside this range are feasible. As seen in FIG. 5B, selective portions of the sacrificial layer 82 are etched to form anchor points 84. As seen in FIG. 5C, a structural layer 86 is deposited atop the sacrificial layer 82 and a plurality of EWOD electrodes 88 are patterned thereon. The formation order the last two layers may be reversed, however, so that a plurality of EWOD electrodes 88 are patterned atop the sacrificial layer 82 and a structural layer 86 is deposited thereon. The structural layer 86 may be formed from a material such as silicon nitride, silicon dioxide, or silicon. As seen in FIG. 5C, the EWOD electrodes 88 are embedded within the structural layer 86, for example, by conducting multiple depositions of the material making up the structural layer 86. As seen in FIG. 5D, release openings 90 are formed in the structural layer 86. Next, as seen in FIG. 5E, the structural layer 86 is released from the substrate 80 by sacrificial etching. The etchant is able to remove the underlying sacrificial layer 82 due to the presence of the release openings 90. Still referring to FIG. 5E, the inner surfaces between the substrate 80 and the structural layer 86 are coated with a hydrophobic material 92. The hydrophobic material 92 may be applied through spin coating, vapor-phase coating, or self-assembled monolayer coating.

Experimental Results

Figure 6:
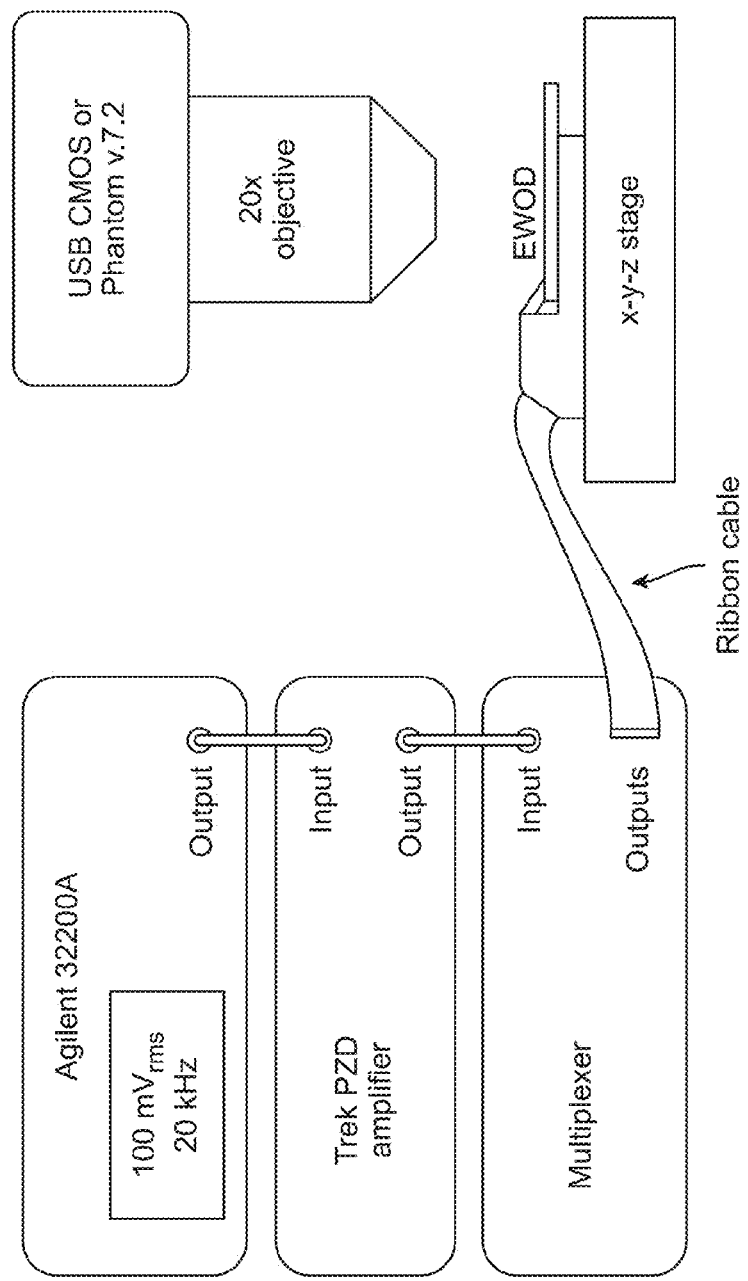
FIG. 6 illustrates an experimental setup used in connection with the monolithic EWOD device.

FIG. 6 illustrates the experimental setup used to perform digital microfluidic operations using a monolithic EWOD device. A function generator (Agilent 32200A) outputs a sinusoidal waveform to a voltage amplifier (TREK PZD700A), which outputs the actuation voltages to a homemade electrical multiplexer having a manually operated array of 10 SPDT Sub-mini lever switches (RadioShack). The multiplexer routes voltages to ten addressable channels via a ribbon cable (3M round conductor flat cable with 1 mm spacing between the wires (28 AWG)) connected to the 34-pin clip holding the EWOD chip. The 34-pin clip, a modified parallel port plug, provides both electrical connections and mechanical clamping to the chip during operation, so no other clamps are necessary. The manual multiplexer was suitable in this study because the tested EWOD devices had ten or less electrodes, many more of which would have required an automated multiplexer.

Videos of EWOD operations were captured using two different cameras, depending on the required frame rate (note that the camera in FIG. 6 represents either a normal USB CMOS camera or a high-speed camera). For most observations, images were recorded at 30 frames per second using a USB digital camera (Edmund Optics CMOS EO-0413C, 752×480 pixels) mounted to an optical microscope (20× objective) on a vibration isolation table. For measuring droplet speeds and tracking the movements of beads inside of droplets, images were recorded at 4000 frames per second using a Phantom v7.2 high speed camera (Vision Research). The setup shown in FIG. 5 allowed open access to the chip for pipette sample loading and extraction.

Evaporation is an important issue for the monolithic EWOD device because droplets have extremely small volumes. In preparation for EWOD testing, the evaporation of water droplets was evaluated and conditions were explored that minimized or eliminated the volume loss. In the EWOD chip designs such as that illustrated in FIGS. 4A-4C, the cavity area is relatively small, and the EWOD electrodes 28 are close to the cavity openings, so the droplets are expected to evaporate nearly as fast as outside the cavity. With all the release openings clear, for instance, a 100 pL water droplet inside the cavity was observed to evaporate completely in about 10 seconds. However, with full reservoirs, a 100 pL water droplet lasted more than 5 minutes (versus 10 seconds) in different devices, where the cavity was designed much deeper and the release openings smaller. In the same condition, a 100 pL 50:50 mix of water and glycerol showed no signs of evaporation in 10 minutes. When a large (~10 µL) liquid droplet was placed on the device to block all the openings, a 100 pL water droplet inside the cavity showed no signs of evaporation over several hours, suggesting the cavity was saturated with water vapor. As expected, when the cavity was filled with oil, no volume loss of water droplets was observed over hours of experimentation.

In preliminary experiments in which droplets were actuated only in oil, it was demonstrated that monolithic EWOD chips could be loaded with liquids via NanoPorts (Upchurch Scientific), which are used commonly in microfluidic devices as micro-to-macro interfaces, i.e., mating microchip inlets/outlets with millimeter-scale tubing. In these preliminary experiments, syringe was used to pump liquids through tubes connected to the NanoPorts, which were bonded to the chip. NanoPorts were used with the monolithic device only as a means to prove the EWOD core functions (creation, transport, and splitting) in the surface micromachined cavity.

In later experiments, the EWOD device was designed for loading without NanoPorts. Specifically, liquids are pipetted directly onto the reservoirs of FIGS. 4A and 4B, which are defined by release openings next to the EWOD cavity. This method enables straightforward loading of nonwetting liquids (contact angle >90°), because they could be deposited onto the reservoirs without flooding the entire chip. Controlled loading of wetting fluids, e.g., organic solvents or oils, on the hydrophobic Cytop surfaces require another method, e.g., the NanoPort.

Figure 7:
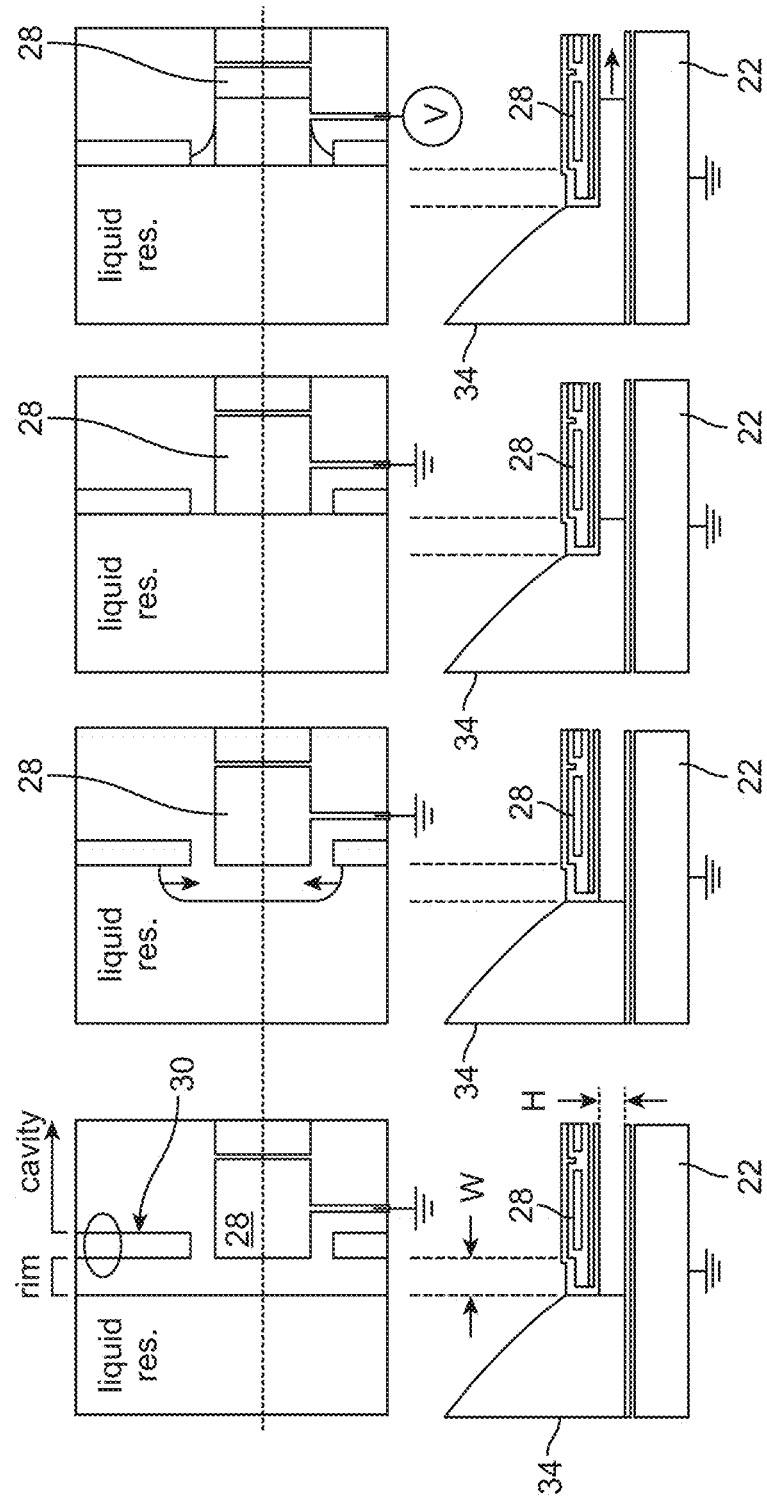
FIGS. 7A-7D schematically illustrate initial loading of the EWOD device. The sequence of FIGS. 7A-7D illustrates the process of filling the rim around the reservoir.

FIGS. 7A-7D illustrates subtle, yet important, details of EWOD chip loading by filling the rim around the reservoir with a nonwetting liquid, e.g., water. For the liquid to be accessible to the EWOD electrodes, it must first occupy the space beneath a rim of membrane that surrounds the reservoir. When a droplet 34 is first loaded as seen in FIG. 7A, the region beneath the rim is dry. To fill, or prime, the reservoir, as seen in FIGS. 7B and 7C, a warm water droplet was deposited onto the chip. This led to condensation within the rim region and complete filling in several seconds. Once primed, as illustrated in FIG. 7D, the chip could be filled with any liquid and operated. Various design modifications will eliminate this priming step in the future, such as using an EWOD electrode that extends into the rim of the membrane and/or reducing the width of the rim itself such that the EWOD forces will liquid directly from the reservoir.

Figure 8:
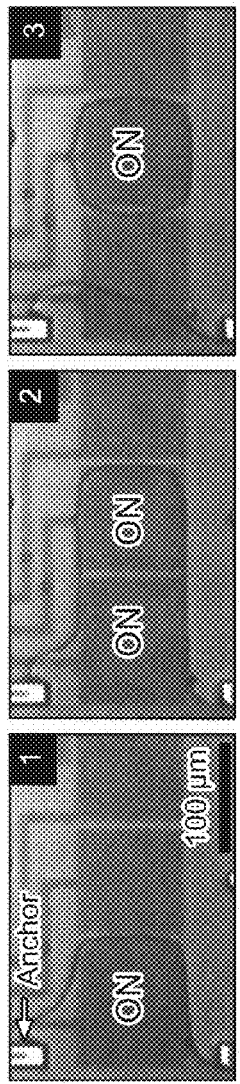
FIG. 8 illustrates a sequence of video frames showing creation of deionized water droplets (100 pL) in air (saturated with water vapor) inside the microcavity using 60 $V_{rms}$ at 20 kHz for EWOD actuation.

The core digital microfluidic functions of droplet creation, transport, splitting, and merging were demonstrated using the monolithic EWOD chip. FIG. 8 illustrates a sequence of video frames showing creation of deionized water droplets (100 pL) in air (saturated with water vapor) inside the microcavity using 60 $V_{rms}$ at 20 kHz for EWOD actuation. Actuated electrodes are labeled "ON" an all other electrodes and silicon substrate are grounded. While droplet transport was repeatable at voltages down to 30 $V_{rms}$, creation was not repeatable below 60 $V_{rms}$. Similarly, droplet splitting required voltages greater than 50 $V_{rms}$ to be repeatable.

Figure 9:
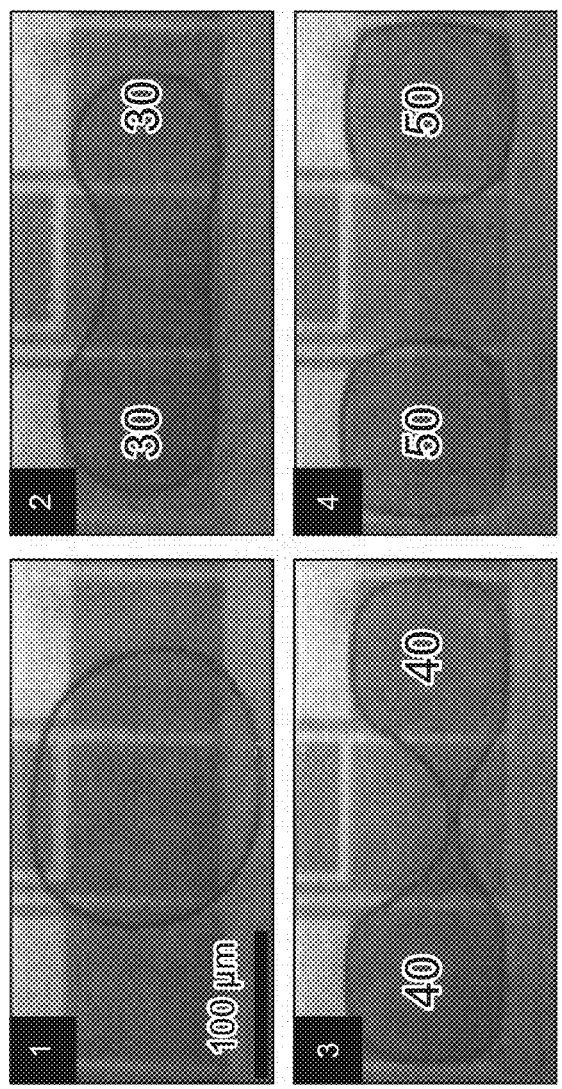
FIG. 9 illustrates a sequence of video frames showing the shape of a droplet at various voltages too low to cause splitting except for the last video frame which illustrates splitting at 50 $V_{rms}$.

FIG. 9 illustrates a sequence of video frames showing the shape of a droplet at various voltages too low to cause splitting except for the last video frame which illustrates splitting at 50 $V_{rms}$. The voltage was applied continuously and increased by 10 V every 3-4 seconds. At 30 $V_{rms}$, as seen in frame #2, the droplet begins to neck, at 40 $V_{rms}$ the neck becomes much thinner as seen in frame #3, and the droplet breaks immediately upon increasing the voltage to 50 $V_{rms}$ (frame #4). A range of actuation frequencies (up to 50 kHz) were tested and it was found that actuation was most reliable at 10 to 20 kHz. Also, the transportation of droplets with 30 $V_{rms}$ was successful at f<30 kHz but not at higher frequencies (tested up to 50 kHz).

In exploring the utilities of the surface-micromachined EWOD chip 20, 60, flow focusing of droplets suspended with particles was examined. With the reported fabrication process, one can optionally incorporate arbitrarily shaped posts or walls in the EWOD cavity at many locations. It is also important to note that such structures are perfectly sealed to the upper and lower inner surfaces of the cavity. This is a consequence of the fact that the vertical structures (anchors) and membrane(s) are made of the same structural layer. It is possible to build constrictions through which droplets can be squeezed by EWOD actuation, thereby accomplishing flow focusing. By flow focusing, this is referring the process by which liquid and suspended particles are forced through an orifice to increase the sensitivity of a measurement, e.g., electrical impedance. Note that flow focusing also refers to the process by which liquid streams are pinched such that they break up into droplets.

Figure 10:
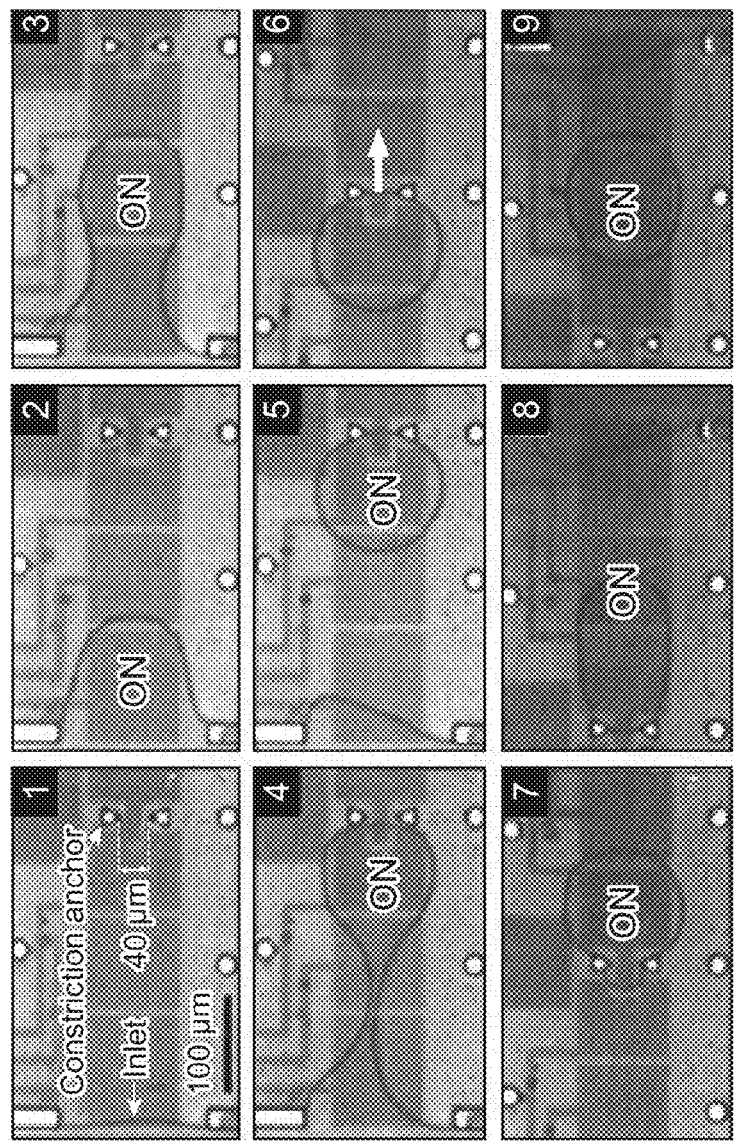
FIG. 10 is sequence of video frames showing the creation, transport, and flow focusing of a droplet through a 40 μm wide constriction defined by the two constriction anchors (triangular-shaped structures).

FIG. 10 is sequence of video frames showing the creation, transport, and flow focusing of a droplet through a 40 μm wide constriction defined by the two constriction anchors (triangular-shaped structures). Flow focusing is often used in microchannels either by physical constrictions or sheath flows to analyze particles one-by-one, e.g., microfluidic cytometry.

Figure 11A:
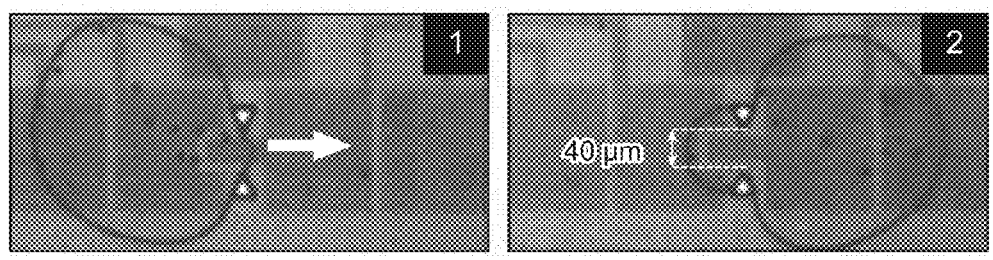
FIG. 11A illustrates video frames of droplet flow focusing of a droplet containing twelve polystyrene beads.
Figure 11B:
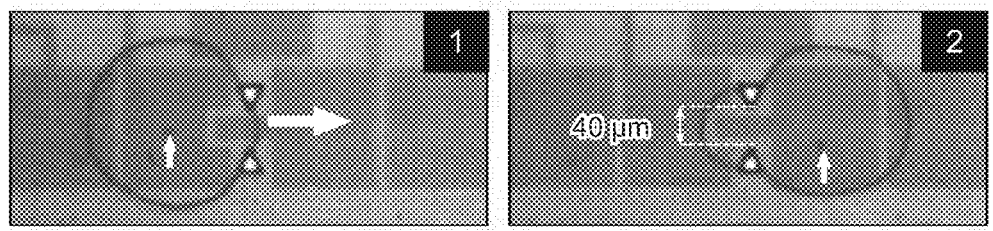
FIG. 11B illustrates video frames of droplet flow focusing of a droplet containing one polystyrene bead (illustrated by arrow).
Figure 11C:
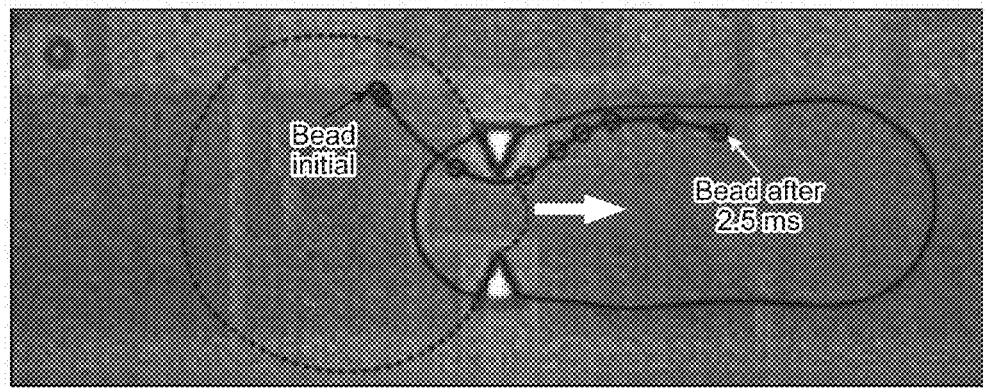
FIG. 11C is a composite image showing the initial meniscus of a droplet (broken line) and final meniscus after 2.5 ms into the focusing actuation (solid line). Also, shown are the locations of the particle at 0.25 ms intervals, which are connected by a line to show its path through the constriction.

FIG. 11A illustrates video frames of droplet flow focusing of a droplet containing twelve polystyrene beads (Invitrogen, Surfactant-Free Fluorescent Nile Red CML Polystyrene Latex, Product No: 2-FN-5000, diameter=5.3 μm). FIG. 11B illustrates video frames of droplet flow focusing of a droplet containing one polystyrene bead. Note the bead diameter is more than a half of the cavity height, rendering particle movements nearly two dimensional. To track the path of the particles through the constriction, it was necessary to use a high-speed camera, recording at 4000 frames per second. FIG. 11C is a composite image showing the initial meniscus of a droplet (broken line) and final meniscus after 2.5 ms into the focusing actuation (solid line). Also, shown are the locations of the particle at 0.25 ms intervals, which are connected by a line to show its path through the constriction.

In the reported EWOD chip, a 100 pL (100 μm×100 μm×10 μm) droplet containing a single 5.3 μm bead was created as follows. First, a droplet was created from a reservoir of liquid containing the beads. If the initial droplet happened to contain several beads, a series of splitting and merging operations were performed to render a droplet containing only one bead. The number of beads within the initial droplet was dependent upon the concentration of beads in the reservoir.

Contamination can be an issue when operating EWOD chips, and the processes used for removing residues prior to or between experiments are different for assembled, plate-based and monolithic devices of the type disclosed herein. For example, it is a common practice in the research setting to assemble chips outside the clean room and risk contamination from the environment. It should be noted that this is less of a concern when oil is used as a filler medium. During experiments, disassembly is often required to clean or recondition the substrate. This can be complicated by the fact that adhesive spacers are generally dissolved by cleaning agents, e.g., organic solvents and sulfuric acid, and need to be replaced. These complications, however, can be avoided by using chemically resistant spacers, e.g., SU-8 or polyimide, that do not need to be replaced during the cleaning process. In any case, the monolithic EWOD device and fabrication process described herein is not subject to contamination from the ambient environment because the chip cavity is created in the clean room. This procedure ensures that there is no initial contamination. Also, the device is relatively impervious to cleaning agents; the only polymers that exist on the chip are Teflon or Cytop, which are exceptionally chemically stable. To clean the monolithic chip between experiments, it can be soaked in a solvent (e.g., acetone) and rinsed with water.

While embodiments have been shown and described, various modifications may be made without departing from the scope of the inventive concepts disclosed herein. The invention(s), therefore, should not be limited, except to the following claims, and their equivalents.

What is claimed is:

1. A method of fabricating an EWOD device comprising:
   providing a substrate having at least a sacrificial layer disposed thereon;
   selectively etching portions of the sacrificial layer to form anchor points;

depositing a structural layer atop the sacrificial layer having a plurality of EWOD electrodes disposed thereon or beneath;

forming a plurality of release openings in the structural layer;

releasing the structural layer containing the plurality of EWOD electrodes from the substrate by sacrificial etching; and coating the surfaces of the structural layer and substrate with a hydrophobic material.

2. The method of claim 1, wherein the sacrificial layer has a thickness that is less than or equal to 20 µm.

3. The method of claim 2, wherein the sacrificial layer has a thickness that is less than or equal to 5 µm.

4. The method of claim 1, wherein the structural layer is formed by multiple depositions.

5. The method of claim 4, wherein the EWOD electrodes are embedded within the structural layer.

6. The method of claim 1, wherein the substrate comprises one of silicon, glass, quartz, and plastic.

7. The method of claim 1, wherein the sacrificial layer comprises silicon.

8. The method of claim 1, wherein the structural layer comprises one of silicon nitride or silicon dioxide.

9. The method of claim 1, further comprising forming a dielectric layer after selectively etching portions of the sacrificial layer to form anchor points and prior to patterning EWOD electrodes.

10. The method of claim 1, wherein the substrate comprises a handle layer of a silicon-on-insulator (SOI) wafer and the sacrificial layer comprises a device layer disposed in the SOI wafer.

11. The method of claim 1, wherein the hydrophobic material is applied by one of spin coating, vapor-phase coating, or self-assembled monolayer coating.

12. The method of claim 1, wherein the plurality of EWOD electrodes are patterned prior to depositing the structural layer.

13. The method of claim 1, wherein the plurality of EWOD electrodes are patterned after depositing the structural layer.

14. The method of claim 1, wherein the plurality of EWOD electrodes are patterned while depositing the structural layer.

\* \* \* \* \*